(12) United States Patent
Cheng et al.

(10) Patent No.: US 6,987,048 B1
(45) Date of Patent: Jan. 17, 2006

(54) MEMORY DEVICE HAVING SILICIDED BITLINES AND METHOD OF FORMING THE SAME

(75) Inventors: Ning Cheng, Cupertino, CA (US); Hiroyuki Kinoshita, Sunnyvale, CA (US); Jeff P. Erhardt, San Jose, CA (US); Mark T. Ramsbey, Sunnyvale, CA (US); Cyrus Tabery, Sunnyvale, CA (US); Jean Yee-Mei Yang, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 209 days.

(21) Appl. No.: 10/635,781

(22) Filed: Aug. 6, 2003

(51) Int. Cl.
*H01L 21/8247* (2006.01)
(52) U.S. Cl. ...................... 438/262; 438/954
(58) Field of Classification Search ........ 438/257–267, 438/957
See application file for complete search history.

(56) References Cited

U.S. PATENT DOCUMENTS

| | | | | |
|---|---|---|---|---|
| 5,120,571 A | * | 6/1992 | Gill et al. ................... | 438/262 |
| 6,248,635 B1 | * | 6/2001 | Foote et al. ................ | 438/287 |
| 6,300,194 B1 | * | 10/2001 | Locati et al. ............... | 438/257 |
| 6,821,847 B2 | * | 11/2004 | Leung et al. ............... | 438/257 |

* cited by examiner

*Primary Examiner*—Richard A. Booth

(74) *Attorney, Agent, or Firm*—Renner, Otto, Boisselle & Sklar, LLP

(57) ABSTRACT

A memory device and a method of fabrication are provided. The memory device includes a semiconductor substrate, a bottom dielectric, a charge storing layer, and a top dielectric in a stacked gate configuration. Silicided buried bitlines, which function as a source and a drain, are formed within the substrate. The silicided bitlines have a reduced resistance, which greatly reduces the number of bitline contacts necessary in an array of memory devices.

5 Claims, 5 Drawing Sheets

MEMORY DEVICE HAVING SILICIDED BITLINES AND METHOD OF FORMING THE SAME

TECHNICAL FIELD

The present invention relates generally to the field of non-volatile memory devices and, more particularly, to a charge trapping dielectric electrically erasable and programmable memory device having silicided bitlines and a method of manufacture.

BACKGROUND

A pervasive trend in modern integrated circuit manufacture is to increase the number of data bits stored per unit area on an integrated circuit memory unit, such as a flash electrically erasable programmable read only memory (EEPROM) unit. Memory units often include a relatively large number of core memory devices (sometimes referred to as memory cells), For instance, a charge trapping dielectric memory device is capable of storing two bits of data in "double-bit" format. That is, one bit can be stored using a memory cell on a first side of the memory device and a second bit can be stored using a memory cell on a second side of the memory device.

Each memory device is operatively arranged to be programmed, read and erased by the application of appropriate voltage potentials. Typically, the gate electrode of each device can be coupled to or formed from a wordline and the source and the drain can each be coupled to or formed from bitlines for applying the various voltage potentials to the corresponding components of the memory device.

Programming of such a memory device can be accomplished, for example, by hot electron injection. Hot electron injection involves applying appropriate voltage potentials to each of the gate electrode, the source, and the drain of the memory device for a specified duration until the charge storing layer accumulates charge.

Memory units are typically comprised of an array of memory devices organized into rows and columns by the placement of wordlines and bitlines. The wordlines extend in a direction transverse to the bitlines and the wordlines and bitlines are separated by a dielectric stack. Typically, voltage potentials are applied to the bitlines using bitline contacts, such as vias and the like, that traverse the dielectric stack.

Conventional bitlines, which function as the source and the drain for each memory device, are typically composed of doped polysilicon (e.g., N+ conductivity or P+ conductivity). While this material is somewhat conductive (at least relative to the adjacent dielectric layers), it still has a relatively high resistance.

Due to the relatively high resistance of conventional bitlines, one bitline contact is required for approximately every sixteen devices (that is, one bitline contact for every sixteen wordline rows). When dealing with memory units having thousands or millions of individual memory devices, a large number of bitline contacts is required. The bitline contacts also consume valuable space on the memory unit and displace wordlines that could be used to operatively form additional memory devices. Also, even with one bitline contact for every sixteen memory devices, memory devices further away from a bitline contact (e.g., memory devices that are about eight rows away from a bitline contact) receive different programming voltages than memory devices adjacent the bitline contacts due to the voltage drop along a bitline section from device to device.

In view of the foregoing, there is an increasing demand for a memory device and method of fabrication to overcome the above-referenced problems and others.

SUMMARY OF THE INVENTION

According to one aspect of the invention, the invention is directed to a non-volatile memory device. The memory device can include a semiconductor substrate and a pair of buried bitlines disposed within the substrate. An upper portion of the buried bitlines consists essentially of silicide. A bottom dielectric layer can be disposed above the semiconductor substrate and a charge storing layer can be disposed above the bottom dielectric layer. A top dielectric layer can be disposed above the charge storing layer and a gate electrode can be disposed above the top dielectric layer.

According to another aspect of the invention, the invention is directed to a method a fabricating a memory device. The method can include providing a semiconductor substrate. A stacked gate is formed over the semiconductor substrate. The stacked gate can include a bottom dielectric layer, a charge storing layer formed over the bottom dielectric layer, a top dielectric layer formed over the charge storing layer, and a gate electrode formed over the top dielectric layer. A pair of silicided buried bitlines are formed within the substrate. The silicided buried bitlines can function as a source and a drain for the memory device.

BRIEF DESCRIPTION OF DRAWINGS

These and further features of the present invention will be apparent with reference to the following description and drawings, wherein.

DISCLOSURE OF INVENTION

Figure 1:
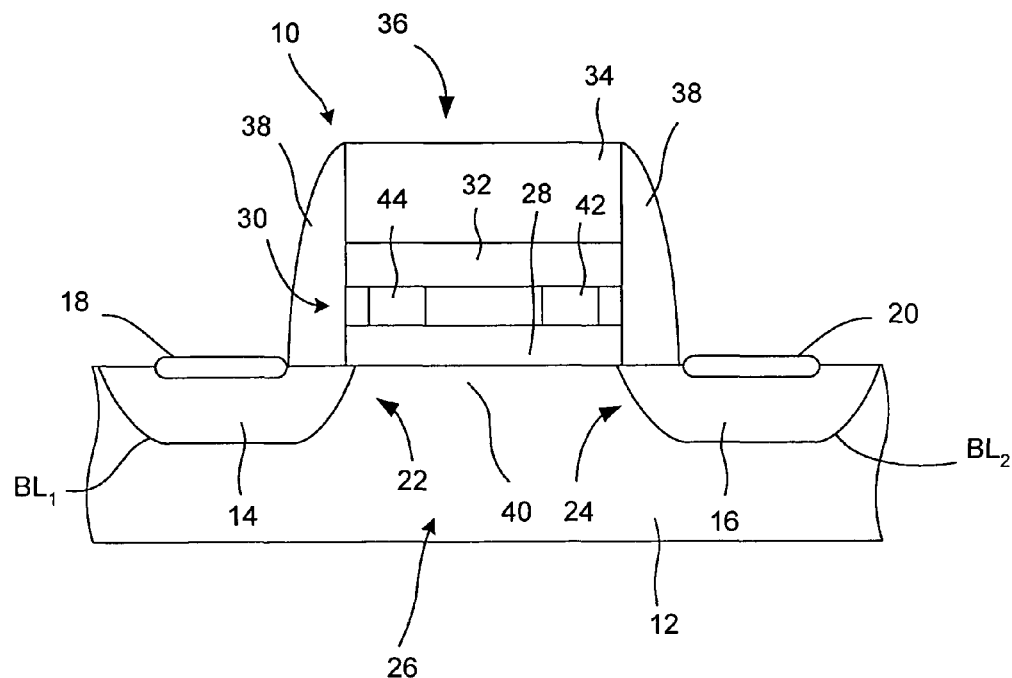
FIG. 1 is a schematic cross-section illustration of an exemplary memory device in accordance with the present invention.

In the detailed description that follows, like components have been given the same reference numerals regardless of whether they are shown in different embodiments of the present invention. To illustrate the present invention in a clear and concise manner, the drawings may not necessarily be to scale and certain features may be shown in somewhat schematic form.

With reference to FIG. 1, an exemplary double-bit charge trapping dielectric non-volatile, electrically erasable and programmable memory device 10 is illustrated. The memory device 10 includes a semiconductor substrate 12. In one embodiment, the substrate 12 can initially be doped to have P-type conductivity (e.g., P dopant concentration).

Within the substrate 12, a pair of buried bitlines $BL_1$, $BL_2$ are formed. As will be described in greater detail below, each buried bitline $BL_1$, $BL_2$ can respectively include an N-type conductivity (e.g., N+ dopant concentration) lower portion 14, 16 and a silicided upper portion 18, 20. In one embodiment, each of the buried bitlines $BL_1$, $BL_2$ forms as a source 22 and a drain 24 during programming and reading operations. Alternatively, the source 22 and drain 24 can be coupled to corresponding bitlines.

A body 26 is formed between the source 22 and the drain 24. The body 26 can have the same dopant type and concentration as the initial dopant of the substrate 12. The substrate 12 and the lower portions 14, 16 of the source 22 and drain 24 can be formed, for example, from a semiconductor, such as appropriately doped silicon, germanium, or silicon-germanium.

Above the body 26 is a dielectric layer 28 (also referred to as a tunneling oxide layer or bottom dielectric layer) that is made from, for example, silicon oxide ($SiO_2$), other standard-K material (e.g., having a relative permittivity below 10) or a high-K material (e.g., having a relative permittivity, in one embodiment, above 10 and, in another embodiment, above 20).

Over the bottom dielectric layer 28 is a charge trapping layer 30 (also referred to as a charge storing layer). The charge storing layer 30 can be made from, for example, a non-conductive material, including silicon nitride ($Si_3N_4$), silicon oxide with buried polysilicon islands, implanted oxide and the like.

Over the charge storing layer 30 is another dielectric layer 32 (also referred to as a top dielectric layer) made from a material such as, for example, silicon oxide, other standard-K material or a high-K material.

Over the top dielectric layer 32 is a gate electrode 34. The gate electrode 34 can be made from, for example, polycrystalline silicon ("poly") or another appropriate material such as a metal or metal oxide. The gate electrode 34, the top dielectric layer 32, the charge storing layer 30 and the bottom dielectric 28 form a stacked gate 36. As will be described in greater detail below, sidewall spacers 38 can be disposed adjacent lateral sidewalls of the stacked gate 36 for use in controlling the formation of the silicided portion 18, 20 of the buried bitlines $BL_1$, $BL_2$ and as alignment aides in positioning bitline contacts. A work function of the stack gate 36 controls a channel 40 within the body 26. The channel 40 extends from the source 22 to the drain 24.

While, for purposes of simplicity of explanation, the methodology of FIGS. 2–11 are shown and described as a series of steps, it is to be understood and appreciated that the present invention is not limited to the order of steps, as some steps may, in accordance with the present invention, occur in different orders and/or concurrently with other steps from that shown and described herein. Moreover, not all illustrated steps may be required to implement a methodology in accordance with an aspect of the invention. Furthermore, additional steps can be added to the fabrication techniques.

Figure 2:
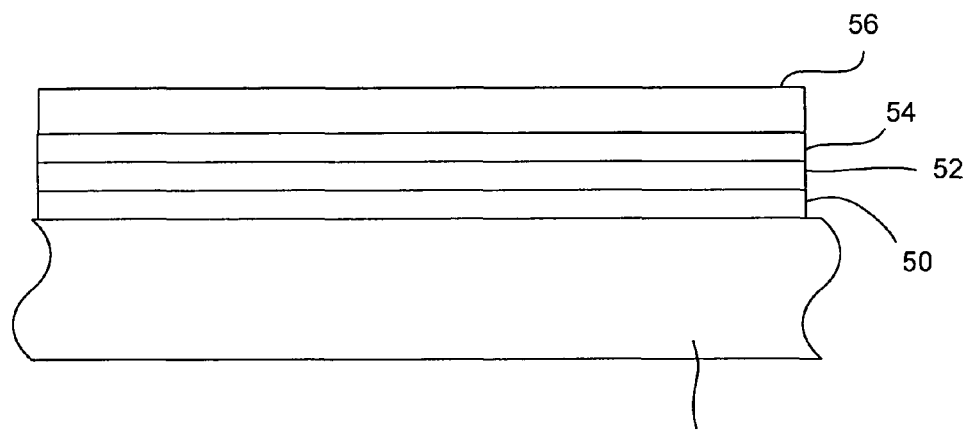
FIGS. 2–10 illustrate side cross-sectional views of fabricating steps in accordance with one embodiment of the present invention; and, FIG. 11 is a top schematic view of a portion of an exemplary array of memory cells in accordance with the present invention.

Referring now to FIG. 2, a method of fabricating the memory device 10 (FIG. 1) will be described in greater detail. As indicated, a semiconductor substrate 12 is provided. The semiconductor substrate 12 can be initially doped with P-type dopant, such as by implanting boron ions, gallium ions or indium ions. As indicated above, the initial substrate 12 doping can provide the desired conductivity for a central portion of the body 26. In one embodiment, the initial substrate 12 doping can have a "P" concentration, a "P+" concentration or a "P−" concentration.

A layer of material 50 used to form the bottom dielectric layer 28 can be grown or deposited on top of the substrate 12. It is noted that the bottom dielectric material layer 50 can optionally be used as an implant screen during the implantation of dopant species into the substrate 12. In this instance, the bottom dielectric material layer 50 can be formed before initial substrate 12 implantation.

As indicated above, the bottom dielectric layer 50 can be formed from an appropriate dielectric material, such as silicon oxide (e.g., $SiO_2$) or a high-K material. High-K materials are materials having, in one embodiment, a relative permittivity of ten (10) or higher and, in another embodiment, of twenty (20) or higher. Although other high-K materials can be selected, hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$), and barium strontium titanate (BST) are suitable high-K materials. In addition, all binary and ternary metal oxides and ferroelectric materials having a K higher than, in one embodiment, about twenty (20) can be used for the bottom dielectric layer 28. The bottom dielectric layer can have a final thickness from about 40 angstroms (Å) to about 400 angstroms (Å) depending upon the material used.

Following formation of the bottom dielectric material layer 50, a layer of material 52 used to form the charge storing layer 30 can be formed on or over the bottom dielectric material layer 50. In one embodiment, the charge storing material layer 52 can be formed from silicon nitride. Other suitable dielectric materials may also be used to form the charge storing layer 30. The charge storing layer can have a final thickness of about 20 angstroms (Å) to about 140 angstroms (Å).

On top of or over the charge storing material layer 52, a top dielectric material layer 54 can be formed. Similar to the bottom dielectric material layer 50, the top dielectric material layer 54 can be made from an appropriate dielectric, such as silicon oxide or a high-K material. The top dielectric layer can have a thickness of about 60 angstroms (Å) to about 150 angstroms (Å).

On top of or over the top dielectric material layer 54, a gate electrode material layer 56 can be formed. The gate electrode material layer 56 can be made from, for example, polycrystalline silicon ("poly") or another appropriate material, such as a metal or metal oxide. In one embodiment, the polycrystalline silicon gate electrode material layer 56 has a thickness of about 500 angstroms (Å) to about 3,000 angstroms (Å).

Figure 3:
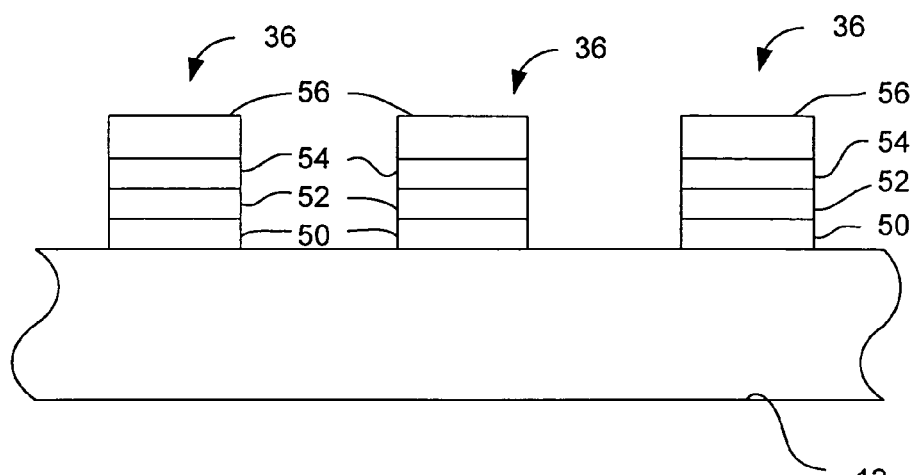

As shown in FIG. 3, after the bottom dielectric material layer 50, the charge storing material layer 52, the top dielectric material layer 54 and the gate electrode material layer 56 have been formed, the stacked gate 36 can be patterned from these layers. It is to be appreciated that the patterning step can also be referred to as a bitline mask and etch step. The layers 50, 52, 54, 56 can be patterned together or in separate steps. In one embodiment, layers 52, 54 and 56 are patterned and the bottom dielectric material layer 50 is left to extend laterally over the substrate 12 to serve as a dopant implant screen. The patterning step can include the formation of a resist layer (e.g., an optical photoresist responsive to visible and near UV light, deep UV resist, and the like) over each stacked gate 36, exposure to radiation of the appropriate wavelength, development to form a resist pattern, and appropriate bitline etching. Alternatively, other photolithography steps may be employed.

Figure 4:
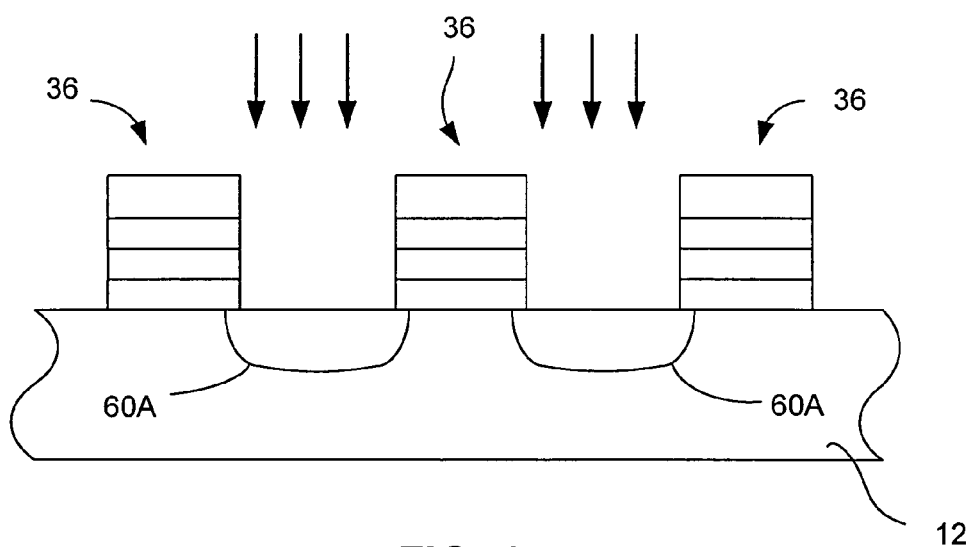

Referring now to FIG. 4, once the patterning and/or etching process is complete, a first ion or dopant implantation process can optionally be carried out to form buried bitline channel stop regions 60A. In one embodiment, a P-type dopant species (e.g., boron) can be implanted at a vertical angle (shown by the arrows in FIG. 4) to form a channel stop implant. Optionally, pocket implant regions (not shown), such as P$^+$ conductivity regions disposed under lateral sides of the stacked gates 36, may be formed within the substrate 12. It is to be appreciated that the stacked gate 36 can function as a self-aligned mask for the dopant implantation.

Figure 5:
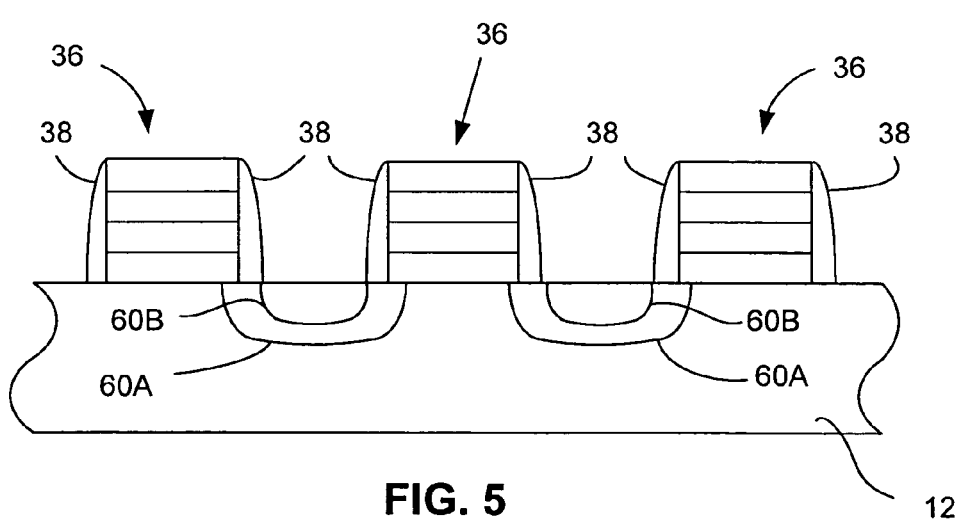

As shown in FIG. 5, the sidewall spacers 38 can be formed. The sidewall spacers can be formed adjacent the lateral sidewalls of the stacked gate 36 using a variety of techniques. For example, a layer of desired spacer material (e.g., silicon nitride, silicon oxide, silicon oxynitride, etc.) can be deposited to at least the height of the stacked gate 36. If desired, the spacer material can be polished (using, for example, chemical mechanical planarization or CMP) back to an upper surface of the gate electrode 34. Then, the spacer material can be anisotropically etched so that the sidewall spacers 38 remain. Alternatively, an oxide liner can be formed by thin film deposition and then the sidewall spacers 38 can be formed.

Once the sidewall spacers 38 are formed, an additional ion or dopant implantation process is carried out to form buried bitline regions 60B. In one embodiment, the buried bitline regions 60B are formed by the dopant implantation of an N-type dopant species (e.g., ions such as antimony, phosphorous or arsenic) at a vertical angle (shown in FIG. 5).

In one embodiment, the buried bitlines regions 60B are formed with sufficient N-type dopant implanted to provide N$^+$ conductivity. For example, in one embodiment, arsenic or phosphorous ion species can be implanted with an energy of about 30 keV to about 60 keV and a dose of about $1 \times e^{13}$ atoms/cm$^2$ to about $4 \times e^{15}$ atoms/cm$^2$. If desired, an anneal cycle (such as a rapid thermal anneal (RTA)) can be carried out to activate the dopant species of the buried bitline regions 60B. The ion implantation energy can be of sufficient magnitude that the buried bitline regions 60B have a depth of at least 100 angstroms (Å). It is noted that the dopant species may diffuse under the stacked gate 36 during one or more subsequent anneal cycles to which the memory device 10 is subjected. Any such diffusion can be accounted for or otherwise controlled by controlling the implant energy, the implant dose, the anneal cycle parameters, pre-amorphization parameters and the like.

Figure 6:
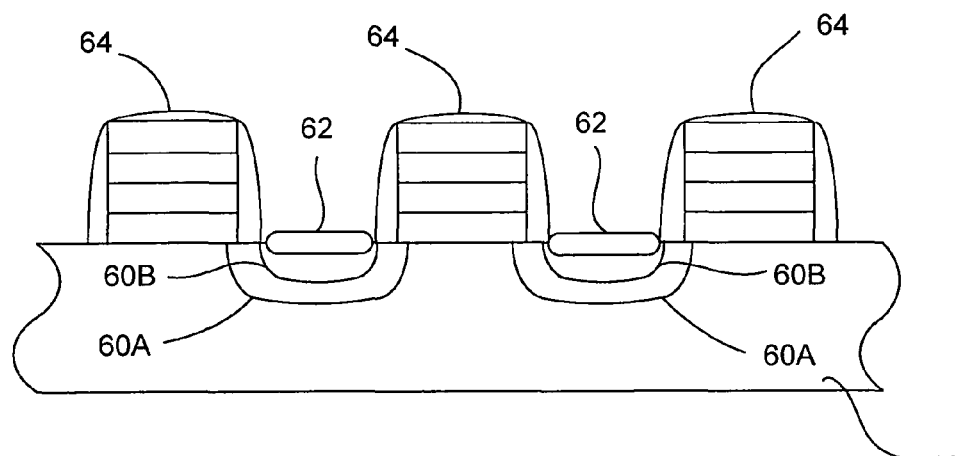

Next, with reference to FIG. 6, silicided upper portions 62 of the buried bitline regions 60B can be formed. In particular, an appropriate metal can be deposited (e.g., by sputtering) over the buried bitline regions 60B. Optionally, the metal will also be deposited over the stacked gates 36 as well to form additional silicided regions 64. Appropriate metals are metals which are capable of reacting with silicon to form a silicide, including, but not limited to cobalt, titanium, nickel, molybdenum, and tungsten. Appropriate thermal processing, such as an anneal cycle, serves to react the deposited metal with the adjacent silicon material to form silicided regions 62, 64 (e.g., CoSi$_x$ and the like).

As is described fully below, providing the buried bitline regions 60B with silicided upper portions 62 results in a greatly reduced bitline resistance, which in turn, allows for far fewer bitline contacts. In addition, greater programming uniformity can be achieved from device to device because the effective voltage applied to each device 10 will be less affected by bitline resistance, resulting in more uniform current loading of the memory devices 10. For example, in one embodiment, the silicided buried bitlines have a resistance of about five (5) ohms per square (e.g., cm$^2$) to about twelve (12) ohms per square (e.g., cm$^2$). It is noted that this value may vary according to device parameters, such as bitline pitch. This resistance value can be compared to about fifty (50) ohms per square to about one-hundred-twenty (120) ohms per square found in conventional bitlines.

Figure 7:
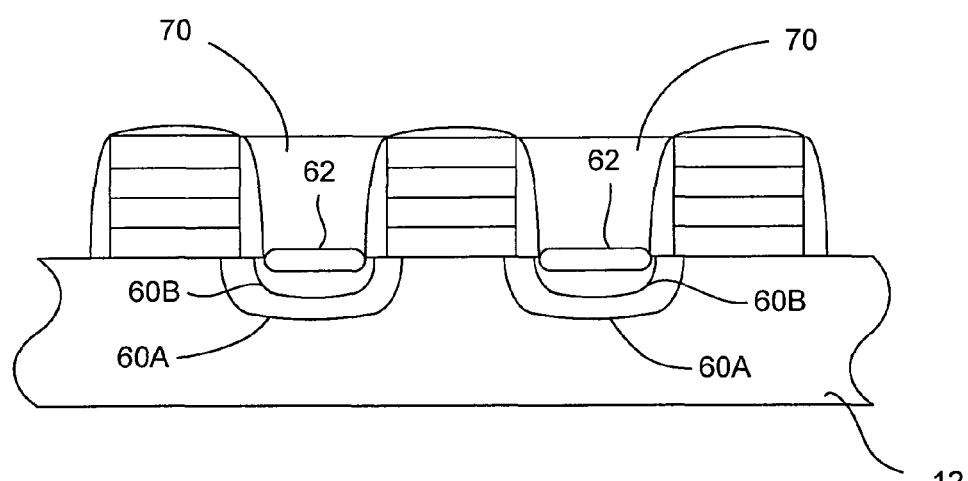

As shown in FIG. 7, the regions above the silicided buried bitline region 60B can be filled with an appropriate dielectric material 70 (forming an interlayer dielectric, such as ILD0), such as silicon oxide or another appropriate standard-K or low-K material. For example, a layer of desired interdielectric layer material 70 can be deposited to at least the height of the stacked gate 36. If desired, the interdielectric layer material 70 can be polished (using, for example, chemical mechanical planarization or CMP) back to an upper surface of the gate electrode 34.

Figure 8:
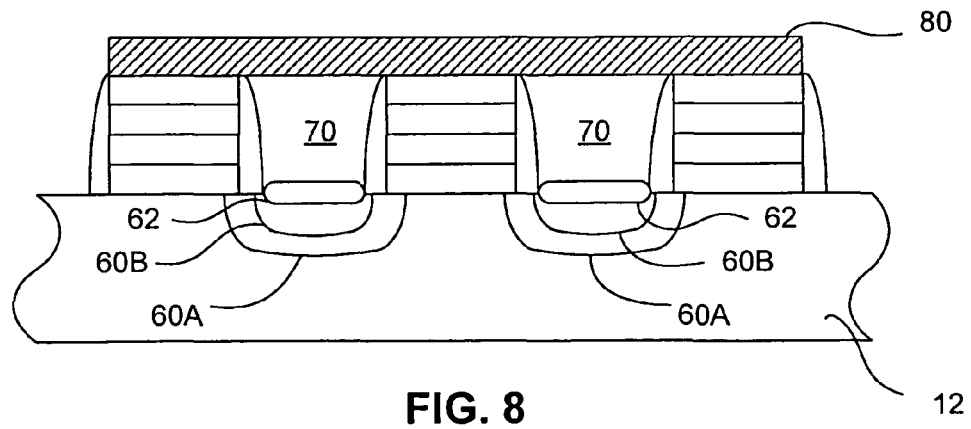
Figure 9:
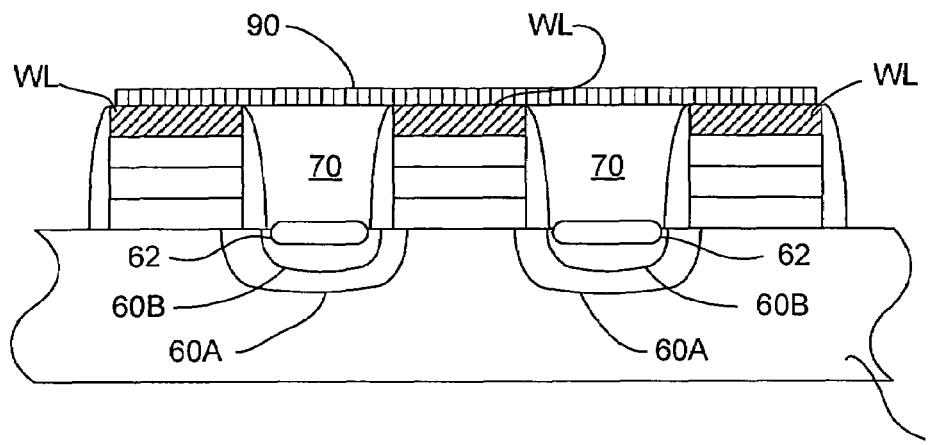

Next, with reference to FIG. 8 and FIG. 9, polysilicon wordline pads WL and local interconnects 90 can be formed. In one embodiment, a layer of material 80, such as polysilicon can be deposited over the stacked gates 36 (with or without silicided contact portions 64) followed by etching steps discussed below. Alternatively, individual, laterally extending local interconnects can be formed through a mask and photolithography process.

Figure 11:
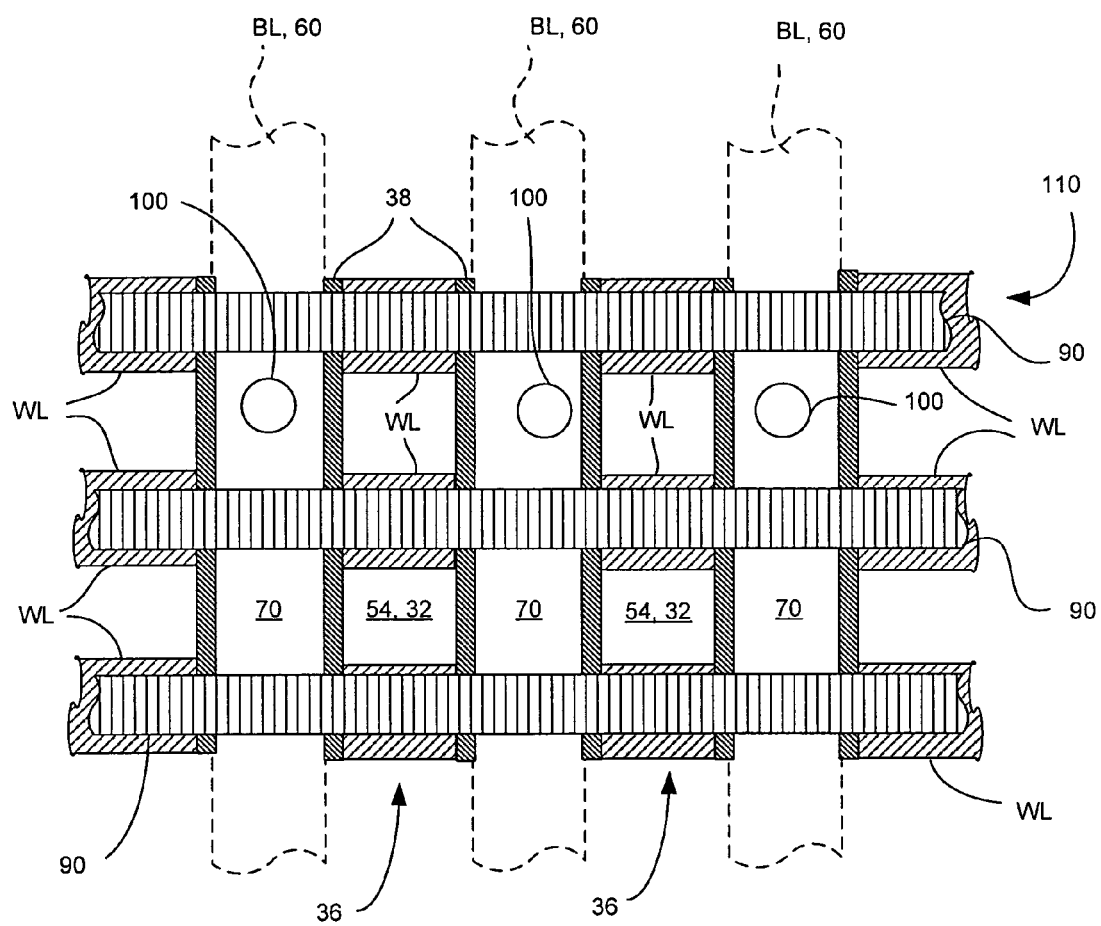

In one embodiment, illustrated in FIG. 8, the polysilicon layer 80 can be etched along the lateral direction, resulting in a plurality of laterally extending local interconnects along the tops of the stacked gates 36 (see FIG. 11 also). It is noted that etching along the lateral direction also removes a portion of the underlying gate electrode layer 56 such that gate electrode layer 56 forms gate electrode 34 of the stacked gate 36 or a wordline pad WL. These wordline pads WL are electrically interconnected by the laterally extending interconnect formed from the polysilicon layer 80. At this point, any gaps can be filled by appropriate interlayer dielectrics (e.g., ILD0) as necessary.

In one embodiment, illustrated in FIG. 9, the deposited polysilicon gate electrode layer 56 can be etched along the lateral direction, resulting in the formation of a plurality of wordline pads WL on top of each of the stacked gates 36 (see FIG. 11 also). The wordline pads WL may be formed within or otherwise surrounded by adjacent interlayer dielectrics (e.g., ILD1, ILD2, etc.) or etching stop layers (e.g., SiN). In one embodiment, the wordline pads WL are substantially rectangular (e.g., substantially square), however other geometries may be employed without departing from the scope of the present invention. The individual wordline pads WL can be electrically connected to one another along laterally extending rows using local interconnects 90 made of, for example, tungsten. In one embodiment, the local interconnects 90 can be individual local interconnects. The local interconnects can be formed using lithography processes within appropriate interlayer dielectrics.

Figure 10:
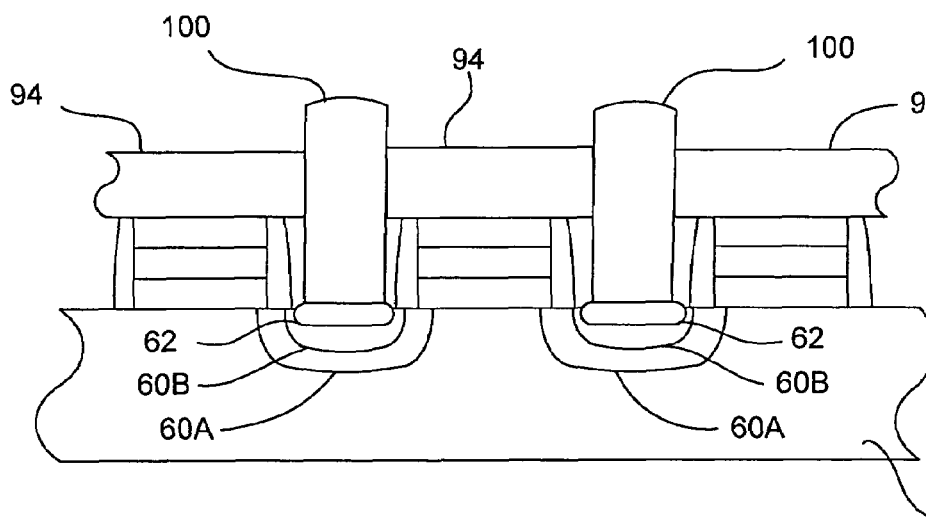

Referring now to FIG. 10 and FIG. 11, a bitline contact 100 can be formed adjacent certain rows (e.g., row 110 in FIG. 11) of an array of memory devices. In one embodiment, a portion of the interdielectric layer (ILD0) 70 can be etched away and filled with an appropriate conductive material, such as a metal or the like to form the bitline contact. It is to be appreciated that the spacers 38 function as a self-alignment aid in the formation of the bitline contacts. In addition, even if a bitline contact 100 is slightly misaligned (see, for example, FIG. 11), the spacers 38 serve to electrically insulate the bitline contact 100 from adjacent device components (e.g., adjacent charge storing cells). Therefore, any difficulty associated with bitline contact alignment between stacked gates 36 should not be problematic. Each bitline contact 100 can be formed at the middle or end of a bitline column BL, according to the designers preference. In one embodiment, an additional layer 94, such as a etch stop layer (ESL) or additional interlayer dielectric (e.g., silicon nitride) can be disposed adjacent the bitline contacts 100.

Because of the greatly reduced bitline resistance of the silicided bitlines $BL_1$, $BL_2$, far fewer bitline contacts are necessary in comparison to conventional devices. For example, in one embodiment, one bitline contact can be formed for every one-hundred (100) rows of memory devices. Alternatively, one bitline contact can be formed for every two-hundred (200) or more rows of memory devices. Alternatively, one bitline contact can be formed at each end of a bitline column, which can be sufficient for an entire memory array. In addition to facilitating a great reduction in the number of bitline contacts required for an array of memory devices, the reduced resistance of the silicided bitlines $BL_1$, $BL_2$ facilitates a more uniform voltage drop from device to device during programming and other operations. Therefore, the current load is more evenly distributed between memory devices within an array.

Referring again to FIG. 1, the memory device 10 is operatively arranged to be programmed, verified, read, and erased by the application of appropriate voltage potentials to each of the gate electrode 34, the source 22, and the drain 24 through the wordline pads WL and the buried silicided bitlines $BL_1$, $BL_2$.

In one embodiment, the memory device 10 can be configured as virtual ground device. That is, during various operations of the memory device 10, either of the source 22 or the drain 24 can function as a source of electrons and either of the source 22 or the drain 24 can be grounded or connected to a bias potential through the bitline contacts.

As will become more apparent from the discussion below, within the charge storing layer 30, the memory device 10 includes a first charge trapping region or cell 42 (also referred to herein as a normal cell, a first charge storing cell or normal bit) adjacent one of the conductive regions (e.g., the bitline $BL_2$, which can function as the drain 24) and a second charge trapping region or cell 44 (also referred to herein as a complementary cell, a second charge storing cell or complementary bit) adjacent the other conductive region (e.g., the bitline $BL_1$, which can function as the source 22).

Each charge storing cell 42, 44 can independently have two data states. The data states can represent binary values, such as a logical zero and a logical one. The logical one, for example, can be implemented by leaving the desired charge storing cell 42, 44 in an unprogrammed state or blank programmed level. The logical zero, for example, can be implemented by storing an amount of charge in the desired charge storing cell 42, 44. This condition is also referred to as a charged state, a programmed state, a programmed level or a charged program level.

In the illustrated embodiment, the memory device 10 is a structurally symmetrical device, allowing for programming, verifying, reading, and erasing of the first charge storing cell 42 and the second charge storing cell 44 by respectively switching the roles of the bitlines $BL_1$, $BL_2$ (the source 22 and the drain 24) during those operations. Therefore, the bitlines $BL_1$, $BL_2$ will be referred to interchangeably by the terms source and drain, depending upon which of the normal bit 42 or the complementary bit 44 is being programmed, verified, read, or erased.

In one embodiment, the programming technique involves hot electron injection, also referred to as channel hot electron injection (CHE). However, it should be appreciated that modifications to the programming techniques can be made to accommodate variations in the specific memory device used.

Using hot electron injection, the first charge storing cell 42 can be programmed by applying voltages to the drain 24 and to the gate electrode 34. The source 22 functions as a source of electrons for the CHE programming of the first charge storing cell 42. In one embodiment, a voltage potential is also applied to the source 22 (rather than grounding or floating the source 22, as found in conventional ONO-flash devices).

The voltages applied to the gate electrode 34, the source 22 and the drain 24 generate a vertical electric field through the dielectric layers 28, 32 and the charge storing layer 30 and a lateral electric field along the length of the channel 40 from the source 22 to the drain 24. At a given threshold voltage, the channel 40 inverts such that electrons are drawn off the source 22 and begin accelerating towards the drain 24. As the electrons move along the length of the channel 40, the electrons gain energy and, upon attaining enough energy, the electrons jump over the potential barrier of the bottom dielectric layer 28 and into the charge storing layer 30, where the electrons become trapped.

The probability of electrons jumping the potential barrier is a maximum in the area of the first charge storing cell 42, adjacent the drain 24, where the electrons have gained the most energy. These accelerated electrons are termed hot electrons and, once injected into the charge storing layer, stay in the first charge storing cell 42 of the charge storing layer 30. The trapped electrons tend not to spread through the charge storing layer 30 due to this layer's low conductivity and low lateral electric field therein. Thus, the trapped charge remains localized in the charge trapping region of the first charge storing cell 42 adjacent the drain 24.

The foregoing technique to program the first charge storing cell 42 can be used to program the second charge storing cell 44, but the functions of the source 22 and the drain 24 are reversed. More specifically, appropriate voltages are applied to the source 22, the drain 24, and/or the gate electrode 34 such that the drain 24 functions as a source of electrons that travel along the channel 40 from the drain 24 towards the source 22. Accordingly, the terms source and drain can be used interchangeably. However, for purposes herein, programming of either charge storing cell 42, 44 will be described using nomenclature such that the source 22 functions as the source of electrons, as us conventional in the art.

Table 1 includes exemplary voltage potentials and pulse durations that can be applied to the gate electrode 34, through the wordline pads WL, the source 22, and the drain 24, through the buried silicided bitlines $BL_1$, $BL_2$, to program the charge storing cells 42, 44. It is noted that the values presented in Table 1 will vary depending on the specific characteristics of the memory device 10 being programmed.

TABLE 1

| | Gate Voltage | Source Voltage | Drain Voltage | Pulse Length |
|---|---|---|---|---|
| First Cell | 9–11 volts | 0 volts | 4–6 volts | 1 $\mu s$ |
| Second Cell | 9–11 volts | 4–6 volts | 0 volts | 1 $\mu s$ |

Verifying, reading, and erasing of the memory device 10 can be carried out using conventional techniques. For example, the charge storing cells 42, 44 can be read in a reverse direction with respect to the direction of programming.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of fabricating a memory device comprising:
   providing a semiconductor substrate;
   forming a stacked gate over the semiconductor substrate, the stacked gate including a bottom dielectric layer, a charge storing dielectric layer formed over the bottom dielectric layer, a top dielectric layer formed over the charge storing dielectric layer, and a gate electrode formed over the top dielectric layer;
   forming a pair of silicided buried bitlines within the substrate, the silicided buried bitlines functioning as a source and a drain for the memory device;
   forming a wordline pad over the stacked gate, the step of forming a wordline pad comprising:
      forming a word line conductor along a first direction perpendicular to the direction along which the silicided buried bitlines extend; and
      selectively etching portions of the wordline conductor substantial above each silicided buried bitline; and
   forming at least one local interconnect in electrical contact with the wordline pad, said interconnect electrically connecting the wordline pad to at least one adjacent wordline pad.

2. The method according to claim 1, wherein the step of forming the silicided buried bitlines comprises:
   implanting N-type ion species into the semiconductor substrate laterally adjacent the stacked gate;
   forming a pair of spacers adjacent lateral sidewalls of the stacked gate;
   depositing a metal over the implanted semiconductor substrate;
   reacting the deposited metal with the semiconductor substrate.

3. The method according to claim 2, wherein the spacers function as a self-aligned mask for formation of the silicided buried bitlines.

4. A method of forming a non-volatile memory unit having a plurality of memory devices organized in rows and columns, where a plurality of bitlines are oriented substantially parallel to one another along a first direction, the method comprising:
   providing a semiconductor substrate:
   forming a plurality of stacked gates over the semiconductor substrate, the stacked gates each including a bottom dielectric layer, a charge storing dielectric layer formed over the bottom dielectric layer, a top dielectric layer formed over the charge storing dielectric layer, and a gate electrode formed over the top dielectric layer;
   forming pairs of silicided buried bitlines within the substrate, the silicided buried bitlines functioning as a source and a drain for each memory device; and
   forming a single bitline contact per 100 or more rows of memory devices, the a single bitline contact being in physical and electrical connection with at least one of the silicided buried bitlines.

5. The method according to claim 4, comprising forming a single bitline contact per at least 200 memory devices.

* * * * *